United States Patent [19]
Cohen et al.

[11] 4,104,564
[45] Aug. 1, 1978

[54] HIGH SWITCHING SPEED HIGH VOLTAGE POWER SUPPLY

[75] Inventors: David A. Cohen, Hauppauge; Charles Lien, Huntington, both of N.Y.

[73] Assignee: Venus Scientific Inc., Farmingdale, N.Y.

[21] Appl. No.: 754,402

[22] Filed: Dec. 27, 1976

[51] Int. Cl.² .............................................. H01J 29/80
[52] U.S. Cl. ................................. 315/171; 315/376; 343/5 CD; 358/73
[58] Field of Search .......................... 315/1, 171–173, 315/244, 283, 375, 376; 313/473; 343/5 CD; 358/73, 72; 307/75, 85, 246

[56] References Cited
U.S. PATENT DOCUMENTS

| | | | |
|---|---|---|---|
| 3,659,190 | 4/1972 | Galluppi | 358/72 X |
| 3,697,880 | 10/1972 | Melchior et al. | 358/72 X |
| 3,780,339 | 12/1973 | Mayle | 315/1 |
| 3,887,838 | 6/1975 | Thurston | 313/473 X |

*Primary Examiner*—Eugene R. LaRoche
*Attorney, Agent, or Firm*—Ostrolenk, Faber, Gerb & Soffen

[57] ABSTRACT

A high voltage power supply for a capacitive load switches between two different voltages of the same polarity relative to ground within about 15 microseconds and is useful as the switching supply for beam penetration cathode ray tubes in short range radar systems. The power supply comprises two power supplies of different voltages which are selectively connected to an output capacitive load. The lower voltage supply is connected directly to the load through a low voltage clamping diode. The higher voltage power supply is connected in series with an inductor, which is, in turn, connected to the load through an up-switch circuit which is closed to increase the power supply output voltage to an upper level and a down-switch circuit which is closed to reduce the power supply voltage to a lower level. Each switch consists of one or more transistors in series with a switching diode. The down-switch circuit is also connected in series with an external, relatively low voltage power supply to guarantee output voltage regulation. A feedback regulator circuit is connected to the high voltage power supply to hold its output voltage constant.

16 Claims, 15 Drawing Figures

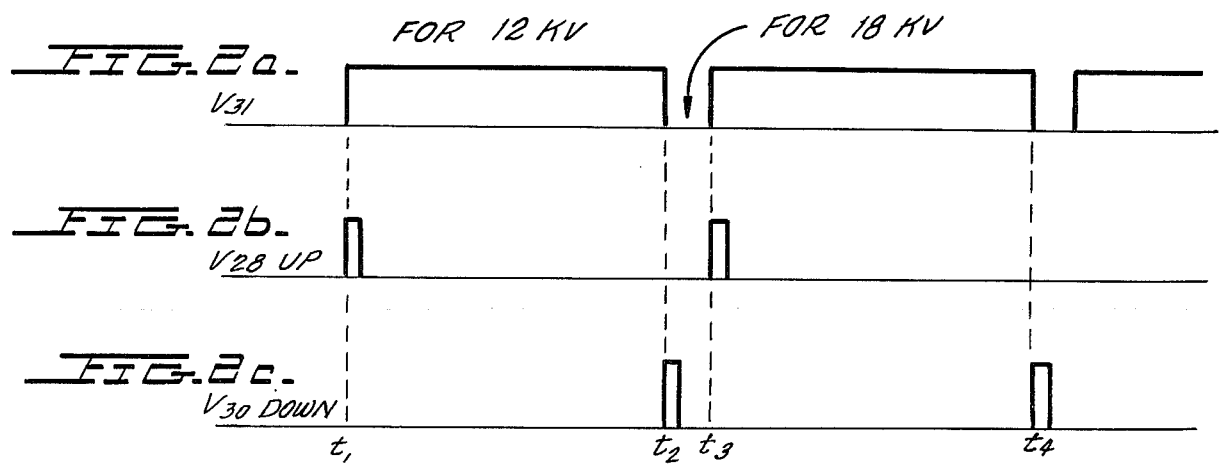
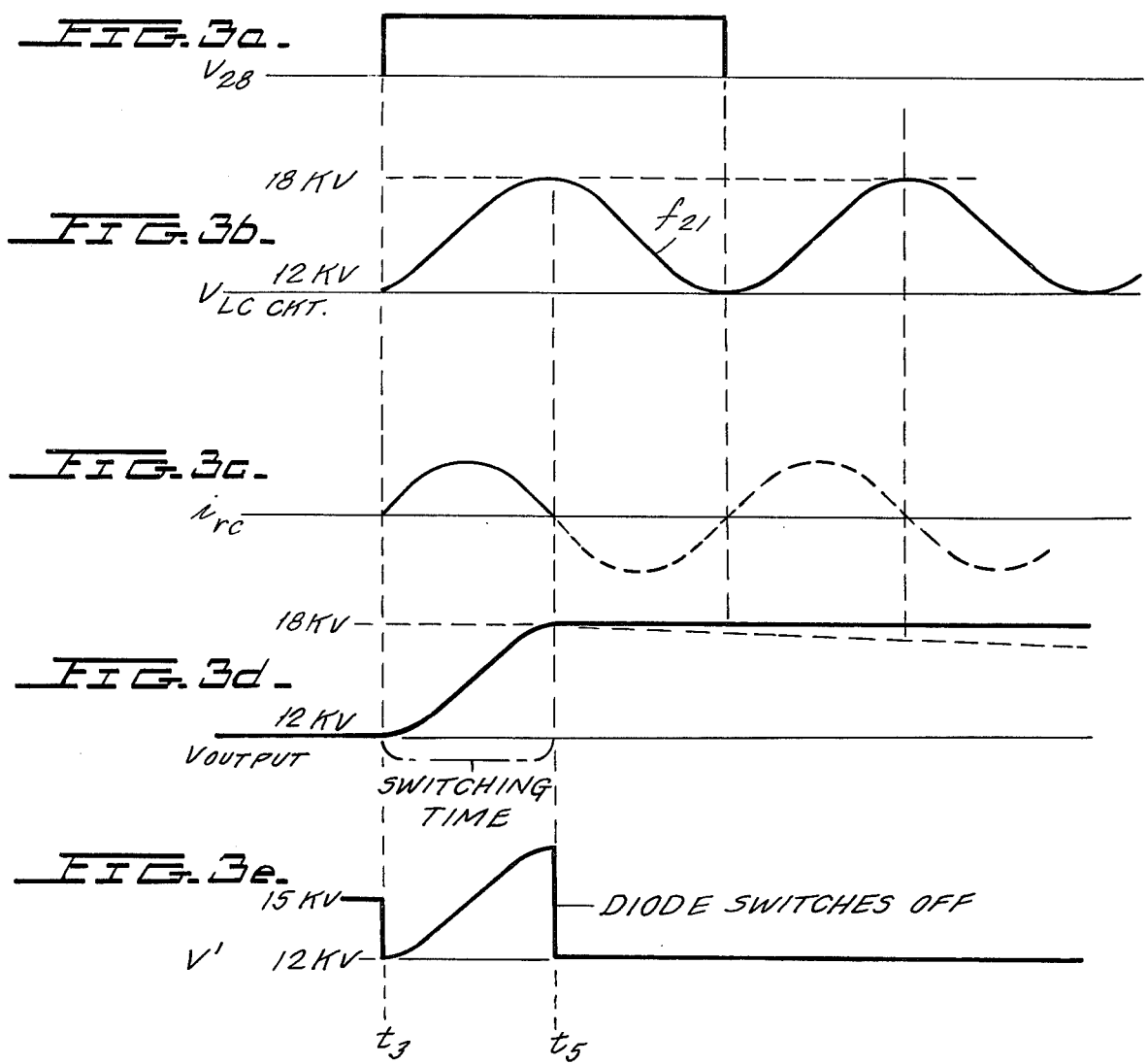

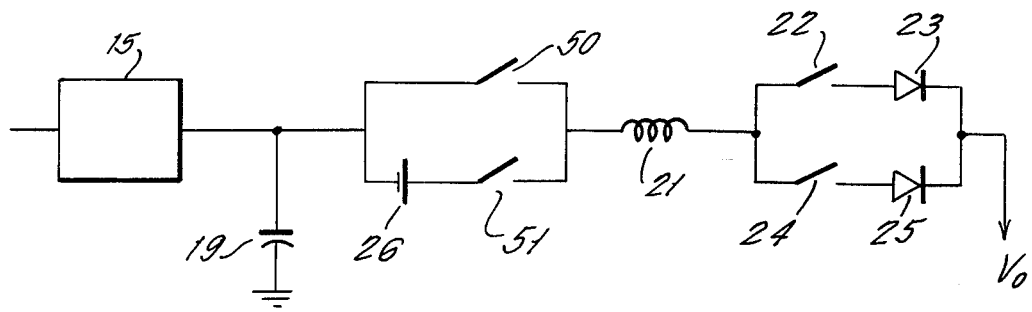
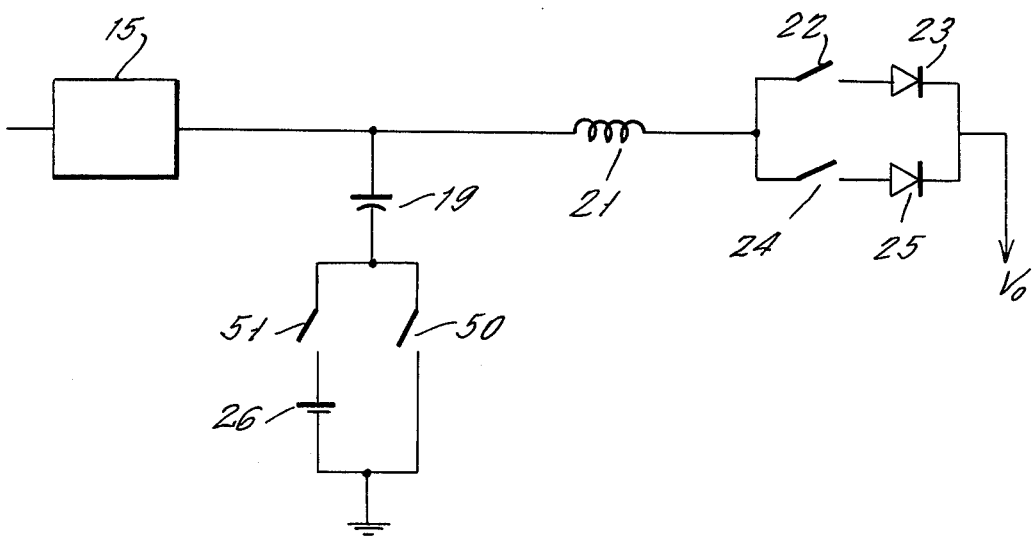

HIGH SWITCHING SPEED HIGH VOLTAGE POWER SUPPLY

BACKGROUND OF THE INVENTION

This invention relates to a high voltage power supply which can switch a capacitive load between two voltage levels above ground voltage, and more specifically relates to a novel switching circuit which can switch energy between a power supply and a capacitive load at speeds less than 20 microseconds, at high repetition rate, and high load volt-amperes, using commercially available solid state components and in a relatively low volume with low power dissipation.

There is a growing need for high voltage power supplies which can be switched between two voltage levels above the ground potential of a load. For example, beam penetration cathode ray tubes are known which have anode voltages which are switched between two voltage levels (e.g. 12 kV and 18 kV) to excite one of two phosphor layers, or both phosphor layers which are on the face plate of the CRT. The two layers may have different characteristics, for example, different colors or different persistences so that the display information will appear in a different mode when written at the high (18 kV) or low (12 kV) anode voltage.

When the tube has a high persistence layer and low persistence layer, the tube is useful for presenting a radar display where the target position information is displayed on the long persistence phosphor (written with the 18 kV anode voltage), while identifying information written adjacent the target, such as target identification, heading, altitude, and the like is written on the short persistence phosphor (written with the 12 kV anode voltage) and is rapidly updated without interference with prior written information. In a typical radar system, target position information is written on the long persistence phosphor with a radial line scan which rotates around the display. Each radial line is written at a time depending on the range of the radar. Thus, if the radar range is 100 miles, the radial line must be written on the high persistence phosphor in about 1200 microseconds at the 18 kV anode voltage. The radial lines are then written at a repetition rate of about 3 kHz, with a recharging period of about 100 microseconds between each repetition. The writing of information on the low persistence layer takes place during this 100 microsecond recharging period at the lower 12 kV anode voltage. Thus, for the system to be operative, the power supply must be able to switch from 18 to 12 kV and back to 18 kV at the beginning and end of the 100 microsecond recharging period while still having enough time (e.g. 60 microseconds) for writing information on the low persistence display. This then leaves only 20 microseconds for switching the power supply at the beginning and end of the recharging interval. Obviously, the faster the switching time, the more information can be written.

Presently existing, solid state power supplies cannot switch at this high speed. For example, power supplies made according to the disclosure of U.S. Pat. No. 3,659,190, dated Apr. 25, 1972, in the name of Filippo B. Galluppi, and assigned to the assignee of the present invention, are commercially available as the power supply type CS 18 from Venus Scientific Inc., Farmingdale, N.Y. These power supplies can switch between 12 and 18 kV, but require about 150 microseconds to switch. If the switching time is made shorter, it would be necessary to make the components excessively large in order to handle the substantial power which would have to be dissipated in a very short time.

Consequently, the above high speed (e.g. less than about 20 microsecond switching of a capacitive load), necessary to provide annotation in a short range radar system, has required the use of special vacuum tube circuits or special information processing circuits and the like which are expensive and bulky.

BRIEF DESCRIPTION OF THE PRESENT INVENTION

In accordance with the present invention, a novel oscillating circuit is provided for permitting relatively low energy-loss switching of a capacitive load between a relatively low and a relatively high voltage relative to ground at high speed. Thus, a relatively low voltage source is connected to clamp the lower voltage output to be applied to the load. A relatively higher voltage power supply is connected to the load through an inductor and transistor switch, and a switching diode. When the transistor switch closes, the output voltage of the load oscillates up to a peak voltage which is the sum of twice the difference in voltage outputs of the two voltage supplies plus the voltage of the low voltage supply. As the circuit current passes through zero following ½ a period of oscillation, it cannot reverse because of the diode, and the circuit switches off at zero current and the load capacitor holds the load voltage at its new high voltage level. A second switching circuit is then provided including a second transistor switch and second diode connected between the inductor and load. When the second transistor switch is closed, an oscillating circuit is formed to allow the load voltage to oscillate down to the low voltage level and the second switching diode prevents reversal of the inductor current after the first current zero and the load capacitor and low voltage power supply holds the load voltage at its low level.

In order to compensate for voltage regulation of the load at its high voltage level, the second switching circuit described above contains an additional and auxiliary voltage source to compensate for voltage loss and to insure that the load voltage will attempt to decrease to less than its rated low voltage output. A switching diode connected to the lower voltage supply acts as a clamp, however, and prevents the low voltage from decreasing below its rated low voltage. A feedback regulator circuit, using relatively simple low frequency design, is then provided to fix the output of the higher voltage supply. Thus, the low and high rated voltages of the loads are accurately maintained.

The novel circuit of the invention is capable of operating to switch a capacitive load between two high voltages, one higher than the other, at speeds less than 20 microseconds, and of the order of the 10 microseconds and at a repetition rate considerably greater than about 1 kHz, with sufficiently low power dissipation that the circuit can be housed in a small package, e.g. less than about one cubic foot. Moreover, the high and low voltage are maintained accurately and within about 0.1% accuracy.

The circuit design is simplified since the turn-off times of the transistor switches is not critical, and all regulation circuits are relatively low response time circuits. Moreover, the transistor switches need only withstand the difference voltage between the two power sources.

It is to be noted that the use of oscillating circuits in connection with switching power supplies per se is known, and is shown for example in U.S. Pat. No. 3,780,339 for switching symmetrically plus and minus voltages about a zero voltage reference. However, the circuit disclosed in the above patent requires identical but oppositely poled power supplies, and cannot be used for switching from a first voltage above ground to a higher voltage above ground, only clamping the lower voltage source to a very accurate value. Moreover, the upper and lower voltage outputs obtained with the present invention can be independently adjusted, and each may be positive or negative relative to ground, or each may be positive and negative respectively relative to ground, but at a different absolute value relative to ground.

BRIEF DESCRIPTION OF THE DRAWINGS

FIGS. 2a, 2b and 2c show the digital output control signals for operating the switching circuit of FIG. 1 on a common time scale.

FIGS. 3a to 3e are diagrams of the operating voltages and currents during switching operation to a higher voltage in FIG. 1 on a common time scale.

FIG. 6 is a modified circuit diagram for the circuit of FIG. 1 in which the auxiliary voltage source is connected in the circuit in a different manner than in FIG. 1.

FIG. 7 shows a further embodiment of the invention and is a circuit diagram, modified from that of FIG. 1 and FIG. 6, showing still another arrangement for the connection of the auxiliary voltage source.

DETAILED DESCRIPTION OF THE DRAWINGS

In the following description of the invention, an example is given for switching a load between a relatively high voltage, chosen to be 18 kV, and a relatively low voltage, chosen to be 12 kV. Clearly, other voltages could have been chosen for the relatively low and high output load voltages. Moreover, the load has been chosen to be illustrated as a capacitive load, such as the anode circuit of a beam penetration cathode ray tube, and the capacitive load has been chosen to be about 1000 picofarads. Clearly, other load values could have been chosen.

Figure 1:
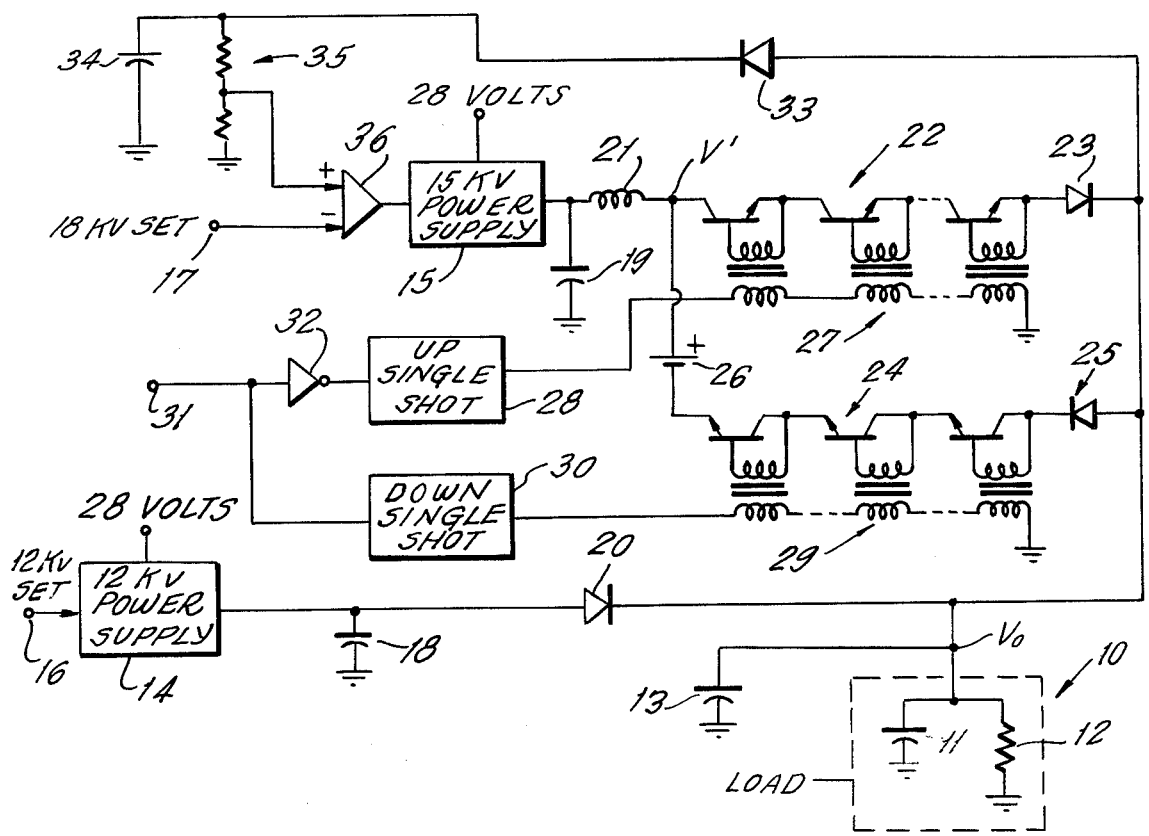
FIG. 1 is a circuit diagram, partly in block-diagram form, of the present invention.

Referring now to FIG. 1, there is shown a high voltage switching power supply for applying to load 10 a relatively high output voltage $V_o$ of 18 kV or a relatively low output voltage $V_o$ of 12 kV and to switch between these two voltages in less than about 20 microseconds with low power dissipation. Load 10 is schematically shown as capacitor 11 with a large parallel resistance 12. When the circuit is designed for a 1000 picofarad load, an appropriate valued additional parallel capacitor 13 may be provided if the load capacitor 11 is less than 1000 picofarads. Load capacity may vary considerably without adversely affecting circuit operation.

The circuit of FIG. 1 contains two separate power supplies 14 and 15 which provide regulated output voltages of 12 and 15 kV, respectively. Power supplies 14 and 15 may be of the type H-20 regulated power supply, sold by Venus Scientific Inc., Farmingdale, N.Y. Each power supply 14 and 15 is energized from a 28 volt d-c source, and the output voltage of each can be adjusted by suitable biases at the 12 kV set terminal 16 and 18 kV set terminal 17, respectively. As will be seen, the power supply 14 supplies the basic d-c load requirements of load 10, and the clamping power. Supply 14 has a capacitor 18 connected to its output to provide a low output impedance for supply 14.

Power supply 15 has a relatively low power output and, as will be seen, supplies the switching losses in switching load 10 between relatively high and low output voltage levels. A capacitor 19 is connected to power supply 15 to decrease its output impedance. Preferably, the capacitance of capacitors 18 and 19 is much greater than the load capacitance of capacitors 11 and 13.

Power supply 14 is connected to the load 10 through diode 20 which has a function to be described later, and which will be seen to cause accurate clamping of the lower output voltage $V_o$ of load 10.

Power supply 15 is connected to load 10 through two parallel switching paths. Each path contains inductor 21 which is a relatively high voltage inductor having an inductance which may be about 3 millihenrys. Other inductance values can be chosen, depending on the resonant frequency desired for inductance 21 and load 10, which, in turn, sets the rise time and decay time of the voltage $V_o$ during switching and thus the switching time.

The first switching path, which is the "up" switching path, contains a string of series transistors 22 and a fast recovery, high voltage diode 23. Any number of transistors can be used, depending on the voltages involved. In the present example, 10 series NPN transistors are provided, each of the type 2N3439. Diode 23 in the present example was a 10 kV diode.

The second switching path contains a transistor string 24 and fast recovery high voltage diode 25 which are similar to transistor string 22 and diode 23, respectively. The second switching path also includes an auxiliary d-c voltage source 26 which may have an output of from 300 to 400 volts. Note that transistor strings 22 and 24 need only handle peak switching current which will be about ½ ampere and must be able to withstand peak reverse voltage of about ½ the peak to peak output voltage swing. Their turn-on time should be in the 1.5 microsecond range, but turn-off time is not critical.

The individual transistors of transistor string 22 are provided with individual pulse transformers 27 having output windings connected to the base-emitter circuit of respective transistors and series-connected input windings. The input windings of transformers 27 are connected to the output of a single-shot circuit 28, hereafter termed the "up" single-shot since a pulse from up-single shot 28 causes the output voltage $V_o$ to increase to its high value of 18 kV. Transformers 29, similar to transformers 27, are provided for transistor string 24 and are energized by a pulse from down-single shot 30.

Down-single shot 30 has its input connected directly to digital pulse input terminal 31, and up-single shot 28 is connected to terminal 31 through inverter 32. Thus, up-single shot 28 is fired by a positive-going pulse at terminal 31 while down-single shot 30 is fired by a negative-going pulse.

FIG. 1 finally shows a feedback circuit for power supply 15 which includes diode 33, a peak detector circuit including capacitor 34 and resistive divider 35, and a difference amplifier 36.

The operation of the circuit of FIG. 1 is now described in connection with FIGS. 2 to 5.

The output voltage $V_o$ is switched between 12 kV and 18 kV in response to the digital signal applied to input terminal 31, and shown in FIG. 2a as voltage $V_{31}$. The voltage $V_{31}$ is a positive signal for about 1200 microseconds and is off for about 100 microseconds in FIG. 2a. As soon as the pulse goes positive, as at times $t_1$ and $t_3$, a signal is applied to the up-single shot 28 to produce a pulse $V_{28}$ (FIG. 2b) which is applied to transformer 27 to turn on transistor string 22. This will later be seen to cause the voltage $V_o$ to switch from 12 kV to 18 kV. Note that the conduction length of single-shot 28 is not critical.

When the digital pulse $V_{31}$ of FIG. 2a goes negative, as at times $t_2$ and $t_4$ in FIG. 2c, the down-single shot 30 produces pulse $V_{30}$. These will then be coupled to transistor string 24 by transformers 29 to turn-on transistor string 24, which will later be seen to cause the voltage $V_o$ to switch from 18 kV down to 12 kV.

Consider first the condition that both transistor switches 22 and 24 are nonconductive, and that the load voltage $V_o$ is 12 kV as required by the direct connection to the output of power supply 14. FIG. 3 show, on an air-expanded time scale, compared to the scale of FIG. 2, the switching of voltage $V_o$ from 12 kV to 18 kV in response to the closing of transistor string 22 at time $t_3$. When transistor string 22 connects, capacitor 19 is connected in closed series relation with inductor 21, diode 23 and load 10. An oscillating circuit is then formed between inductor 21 and capacitor 19 and load capacitors 11–13, and the circuit oscillates at a frequency essentially determined by $f_{21} = 1/(2\pi\sqrt{LC_{11-13}})$. This oscillating voltage waveform is shown in FIG. 3b as voltage $V_{LC}$ (which appears at the load 10) and it begins after the pulse $V_{28}$ (FIG. 3a). The current flow $i_{LC}$ which flows on the resonant circuit is shown in FIG. 3c. This current is almost 90 degrees out of phase with the voltage $V_{LC}$ of FIG. 3b, and, in fact, current $i_{LC}$ flows only for the first half-loop, and, as it attempts to reverse, the current $i_{LC}$ is out off by diode 23, at time $t_5$. Note that the voltage $V_{LC}$ will, after switch 22 is closed, oscillate about 15 kV, with an excursion of plus and minus 3 kV. Thus, the voltage oscillates between 12 kV and 18 kV instantaneous voltage.

Once diode 23 cuts off current $i_{LC}$ at time $t_5$, the voltage $V_o$ remains at 18 kV, as shown in FIG. 3d, and the voltage V' is at 18 kV as shown in FIG. 3e, since the current flow cannot reverse to discharge capacitors 11 and 13 into capacitor 19. Thus, the low transfer of energy has been accomplished to load capacitors 11–13 in a switching time $t_5 - t_3$ which equals one-half the period of frequency $f_{21}$. This time is of the order of 15 microseconds, as controlled by the oscillating frequency of the oscillating circuit which includes inductor 21 and capacitors 11 and 13 and, in the example herein, is about 15 microseconds.

Figure 4A:
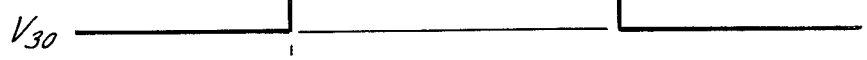
FIGS. 4a to 4c are diagrams of the operating voltages during switching operation to a lower voltage in FIG. 1 on a common time scale.
Figure 4B:
Figure 4C:
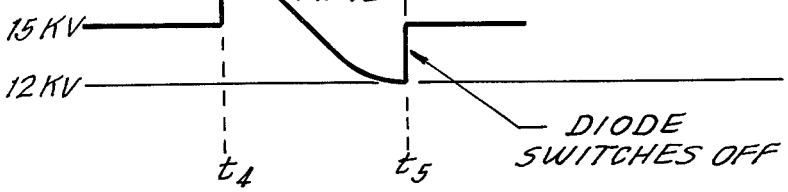

The down operation of FIG. 1, reducing the load voltage $V_o$ from 18 kV to 12 kV, is shown in FIG. 4 and is similar to that described for the up operation. Thus, down operation is initiated at time $t_4$ by down pulse $V_{30}$ from down-single shot 30, as shown on an expanded scale in FIG. 4a. This pulse causes transistor string 24 to conduct, thus forming the resonant circuit which includes capacitor 19, diode 25, and load 10. (The function of voltage source 26 shall be described hereinafter). As in the case of FIG. 3, the output voltage $V_o$ follows the resonant voltage wave-shape until current flow in the resonant circuit completes its first half-loop and attempts to reverse. The reversal of this current is prevented by diode 25 at time $t_6$ in FIG. 4, and the voltage $V_o$ at $t_6$ is held to its lower peak of 12 kV. Note that the instant the diode 25 switches the oscillating circuit current off, the voltage V' (FIG. 4c) switches to 15 kV.

The above description of the operation of the circuit of FIG. 1 ignored the regulation of the voltage due to losses in the non-ideal circuit.

Figure 5:
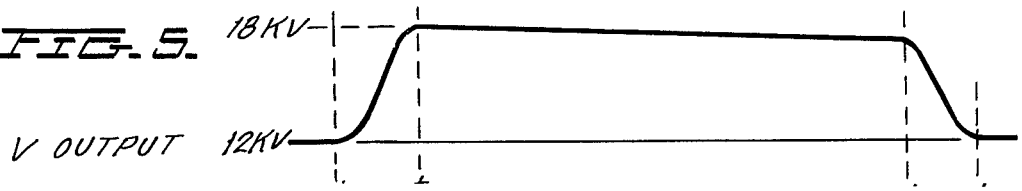
FIG. 5 shows the output voltage applied to the load of FIG. 1 for one full cycle of switching.

In the above description of operation, it will be noted that the switching times are the times $t_5 - t_3$ and $t_6 - t_4$ in FIG. 5. In the example shown, this time is about 15 microseconds. This time can be altered simply by changing the load capacitance 11–13 which, in the above application, is about 1000 picofarads.

In order to change switching time, this load capacitance value may be changed to change the resonant frequency of the circuit so that an increase in capacitance would decrease the resonant frequency and increase switching time and vice versa. Note that, in the resonant circuit, if it were not for diode 23 or 25, the voltage $V_o$ at load 10 would appear to be a damped sine wave which, theoretically, would have peaks at 12 kV and 18 kV initially. The diodes 23 and 24 operate to switch this oscillation after the first half-cycle of current, and the voltage on the load 10 remains fixed at the last value set in the manner of a peak voltage detector circuit.

As a practical matter, the voltage characteristic for the output voltage $V_o$ will have a slightly drooping characteristic in FIG. 5 due to regulation caused by the flow of current through the load resistance 12.

In order to compensate for this drooping regulation characteristic which could cause the circuit to operate inaccurately, the auxiliary voltage source 26 is added to the circuit to insure that, when the voltage switches from the 18 kV level down to the 12 kV level, the output voltage $V_o$ will attempt to go below the 12 kV value. This, however, is prevented by diode 20 which serves to clamp the lowest output voltage $V_o$ of the load 10 at the 12 kV level. Note that, if the diode 20 were not present, the actual negative peak voltage which would be reached during the down-switching operation at the output $V_o$ would be greater than 12 kV. This occurs because the difference between the 18 kV output less droop and the 15 kV supply less $V_{26}$ is made less than 3 kV by design of the $V_{26}$ voltage.

In order to maintain the high output voltage $V_o$ at an accurate 18 kV level, a simple feedback regulator circuit is provided which includes feedback diode 33, the peak detector consisting of capacitor 34 and resistive divider 35 and the difference amplifier 36. The difference amplifier is then provided with an input reference signal at terminal 17 which is the 18 kV set adjustment, and it will adjust the output of the 15 kV power supply 15 so that the output voltage $V_o$ is maintained at the 18 kV level during the time that high voltage output is required of the circuit. Note that this feedback regulation circuit is of a simple nature and need have low speed and, therefore, easily fabricated.

It should be noted that it is unnecessary to accurately clamp the upper 18 kV voltage limit since all voltage clamping is accomplished at the 12 kV voltage level by the diode 20 operating in connection with the compensating voltage source 26. That is to say, regulation in the present invention is obtained by two different techniques at two different output levels. At the low level output, regulation is obtained by the clamping diode 20 so that the characteristic of the 12 kV power supply 14 determines the overall system regulation at the 12 kV output level. At the high voltage output level, however, load regulation is determined by the load resistance, load capacitance, the repetition rate of the system, and the peak value of the high voltage output is maintained by the peak detector feedback arrangement including differential amplifier 36 and peak detector circuit 34–35.

In the embodiment of FIG. 1, it will be understood that the upper and lower voltages are absolute voltage values relative to ground. The circuit could also be arranged to have both values for $V_o$ negative relative to ground as well as positive relative to ground, and further one could be negative and the other positive relative to ground and at different absolute values.

The method of inserting the auxiliary voltage source 26 in the down switch during a down switching operation can be carried out in other ways than that shown in FIG. 1. For example, the source 26 could be connected in series with inductor 21 and source capacitor 19, with suitable switching to connect the source 26 in the circuit only during a down switching operation. Two circuits for accomplishing this in the circuit of FIG. 1 are shown in FIGS. 6 and 7, respectively, wherein the schematically illustrated transistor switches 22 and 24 are operated simultaneously with switches 50 and 51, respectively, which may also be transistor switches.

Although a preferred embodiment of this invention has been described, many variations and modifications will now be apparent to those skilled in the art, and it is therefore preferred that the instant invention be limited not by the specific disclosure herein but only by the appended claims.

The embodiments of the invention in which an exclusive privilege or property is claimed are defined as follows:

1. A high voltage power supply for supplying at least first and second high voltage outputs to a capacitive load; said power supply comprising first and second voltage sources having different high voltage outputs, an inductive means, first and second high speed switching means and first and second diodes connected in series with said first and second high speed switching means; said series-connected first switching means and first diode being connected in parallel with said series-connected second switching means and second diode; said first and second diodes being poled in opposite directions; and first and second high speed switch operating means operable for closing said first and second switching means respectively in order to switch said power supply output between said first and second voltage outputs; said first voltage source being connected directly to said capacitive load; said second voltage source being connected in series with said inductive means and said capacitive load, and in series with said parallel connection of said first and second high speed switching means and said respective first and second diodes respectively; said inductive means being resonant which said capacitive load at a given frequency, whereby the switching speed of said supply is about one-half the period of said given frequency.

2. The high voltage power supply of claim 1 wherein said first high voltage output is determined by the output voltage of said first voltage source, and wherein said second voltage output is equal to the output voltage of said first voltage source plus twice the absolute difference between the output voltages of said first and second voltage sources.

3. The high voltage power supply of claim 2 wherein said first and second voltage sources have output voltages of about twelve thousand and fifteen thousand volts respectively.

4. The high voltage power supply of claim 2 wherein said first and second switching means are comprised of first and second series-connected transistor strings respectively.

5. The high voltage power supply of claim 2 wherein switching between said first and second high voltage outputs occurs in about fifteen microseconds.

6. The high voltage power supply of claim 1 wherein said load includes an electron tube having a first capacitance; and a second auxiliary load capacitor connected in parallel with said electron tube to increase the capacitance of said capacitive load to a given value.

7. The high voltage power supply of claim 2 wherein said first voltage output is lower than said second voltage output.

8. The high voltage power supply of claim 2 which further includes an auxiliary voltage source, and circuit means for connecting said auxiliary voltage source in series with said first switching means when said first switching means is closed and for disconnecting said auxiliary voltage source when said second switching means is closed; and a clamping diode in series with said first voltage source for clamping the lowest output voltage on said load to the output voltage of said first voltage source.

9. The high voltage power supply of claim 2 which further includes voltage regulator means connected to said second voltage source for regulating the output voltage of said second source to maintain said second output voltage at a fixed high voltage.

10. The high voltage power supply of claim 8 wherein said first and second voltage sources have output voltages of about twelve thousand and fifteen thousand volts respectively.

11. The high voltage power supply of claim 10 wherein said first and second switching means are comprised of first and second series-connected transistor strings respectively.

12. The high voltage power supply of claim 11 wherein switching between said first and second high voltage outputs occurs in about 15 microseconds.

13. The power supply of claim 4 which further includes transformer means for coupling said first and second switch operating means to said first and second transistor strings respectively.

14. The power supply of claim 4 wherein said first and second switch operating means comprise first and second single shots; and an input pulse signal means operable for triggering one or the other of said single shots in order to apply a switching signal to said first and second transistor strings respectively.

15. The power supply of claim 8 wherein said auxiliary voltage source is connected in series with said first switching means and in parallel with said second switching means.

16. The power supply of claim 8 wherein said circuit means comprises first and second auxiliary switch means respectively in series with and in parallel with said auxiliary voltage source; and auxiliary switching operating means for opening and closing said first and second auxiliary switches with said first and second high speed switching means respectively.

* * * * *